(12) United States Patent
Gabl

(10) Patent No.: US 7,750,442 B2
(45) Date of Patent: Jul. 6, 2010

(54) HIGH-FREQUENCY SWITCH

(75) Inventor: Reinhard Gabl, St. Peter (AT)

(73) Assignee: Infineon Technologies AG, Munich (DE)

( * ) Notice: Subject to any disclaimer, the term of this patent is extended or adjusted under 35 U.S.C. 154(b) by 1254 days.

(21) Appl. No.: 11/064,762

(22) Filed: Feb. 23, 2005

(65) Prior Publication Data

US 2005/0242412 A1 Nov. 3, 2005

Related U.S. Application Data

(63) Continuation of application No. PCT/EP03/06791, filed on Jun. 26, 2003.

(30) Foreign Application Priority Data

Aug. 23, 2002 (DE) ................................ 102 38 798

(51) Int. Cl.
*H01L 27/15* (2006.01)
(52) U.S. Cl. ........................ 257/656; 257/482; 257/601; 257/367; 257/594; 257/625; 257/E29.336
(58) Field of Classification Search ................ 257/656, 257/601, 482, 367, 594, 625, E29.336
See application file for complete search history.

(56) References Cited

U.S. PATENT DOCUMENTS

| 4,745,451 | A | * | 5/1988 | Webb et al. ................. 257/436 |
| 5,047,829 | A | | 9/1991 | Seymour et al. |
| 5,081,514 | A | * | 1/1992 | Ueoka ........................ 257/355 |
| 5,144,157 | A | | 9/1992 | Russell et al. |
| 5,338,964 | A | * | 8/1994 | Bernier ...................... 257/476 |
| 5,597,758 | A | * | 1/1997 | Heim et al. ................. 438/527 |
| 5,719,414 | A | * | 2/1998 | Sato et al. .................... 257/186 |
| 5,777,367 | A | * | 7/1998 | Zambrano ................... 257/355 |
| 6,031,254 | A | * | 2/2000 | Quoirin ...................... 257/155 |
| 6,222,248 | B1 | * | 4/2001 | Fragapane .................. 257/565 |
| 6,504,178 | B2 | * | 1/2003 | Carlson et al. ............... 257/86 |
| 6,870,241 | B2 | * | 3/2005 | Nakatani et al. ............ 257/531 |
| 2001/0019158 | A1 | | 9/2001 | Tsujikawa et al. |
| 2002/0167007 | A1 | * | 11/2002 | Yamazaki et al. ............. 257/57 |
| 2003/0085416 | A1 | * | 5/2003 | Brogle et al. ................ 257/275 |

FOREIGN PATENT DOCUMENTS

| DE | 692 26 225 T2 | 2/1999 |
| JP | 57128983 | 8/1982 |
| JP | 05067729 | 3/1993 |
| WO | WO 01/71819 A2 | 9/2001 |

\* cited by examiner

*Primary Examiner*—Eugene Lee
(74) *Attorney, Agent, or Firm*—Maginot, Moore & Beck

(57) ABSTRACT

A high-frequency switch includes a semiconductor body made of a semiconductor material having a first surface and a second surface, and two direct current terminals and two high-frequency terminals.

23 Claims, 2 Drawing Sheets

HIGH-FREQUENCY SWITCH

CROSS-REFERENCE TO RELATED APPLICATION

This application is a continuation of copending International Application No. PCT/EP03/06791, filed Jun. 26, 2003, which designated the United States and was not published in English, and is incorporated herein by reference in its entirety.

BACKGROUND OF THE INVENTION

1. Field of the Invention

The present invention relates to a high-frequency switch.

2. Description of Prior Art

PIN diodes are frequently employed as switches for high frequencies in the GHz range.

PIN diodes are semiconductor diodes containing a pin junction as a basic structure, which basically determines the electronical characteristics of this element.

The pin junction differs from a pn junction of a conventional semiconductor diode in particular by an intrinsic (i) layer between the p and n regions (highly doped regions $p^+$ and $n^+$). In the flow direction, this i layer is flooded by the two adjacent highly doped regions with holes and electrons, the result being an intense recombination in the center layer. The result is a very low forward resistance and the characteristic curve does not differ significantly from that of the pn junction. In the reverse direction, however, the entire I zone is depleted of charge carriers and the result is, compared to the pn junction, a considerably broader depletion layer and consequently a higher breakdown voltage up to several 1000 volts. A second effect of the i layer is the decrease in the depletion layer capacitance.

Due to these characteristics PIN diodes are frequently used as rectifier diodes for very high reverse voltages. Another field of application as a fast switch in the microwave range results from the low, mostly voltage-independent capacitance and the high ratio of forward resistance to reverse resistance. This is the basis for applications as microwave rectifiers, switches and as current-controllable resistors, for example for regulating HF tuners.

In particular, the attenuation in the flow operation determined by the resistance of the intrinsic zone, and the insulation depending on the depletion layer capacitance in the reverse direction are quality characteristics of the PIN diode. Intermodulation as a consequence of non-linearities is another quality characteristic.

A considerable disadvantage of the PIN diode is the considerable current flow in the forward direction. The result is that the PIN diode cannot be switched without power. The current in the forward direction is determined by injection and recombination of minority charge carriers at the highly doped p and n regions. This injection and recombination, apart from the dopant concentration of the p and n regions, particularly depends on the area thereof. This area in turn is determined by requirements as regards capacitance and series resistance.

It is another disadvantage of the PIN diode that the high-frequency (HF) path and the direct current (DC) path in the element are not separate. Further elements are consequently necessary in applications as a high-frequency switch. In particular, these elements are coupling capacitors and coils which can be realized discretely or in the form of lines.

In addition, the high-frequency signal at the PIN diode causes a small injection, following the high frequency, of charge carriers into the i zone. The resulting non-linearity determines the intermodulation performance of the diode in a negative way.

SUMMARY OF THE INVENTION

It is the object of the present invention to provide a high-frequency switch comprising the characteristics of a PIN diode as regards transmission loss and insulation but reduces the disadvantages of a PIN diode mentioned above.

In accordance with a first aspect, the present invention provides a high-frequency switch having: a semiconductor body made of a semiconductor material having a first surface and a second surface; two direct current terminals; and two high-frequency terminals.

In the high-frequency range ($\geq 1$ GHz), the inventive high-frequency switch combines the positive characteristics of low transmission loss and high insulation in the reverse direction by the following positive characteristics:

small current in the forward direction (with constant high-frequency resistance or constant insertion loss), galvanic separation of HF path and DC path, wherein at least coupling capacitors can be omitted here, better intermodulation performance due to smaller non-linearities.

An advantageous development of the inventive assembly provides for the semiconductor material to have a resistivity of greater than 100 ohm/cm. Consequently, the semiconductor material can serve as the i zone for a PIN diode.

Another advantageous development of the inventive assembly is for the semiconductor material to be intrinsic. Thus, the semiconductor material, without additional treatment, serves as the i zone of a PIN diode.

An alternative embodiment of the inventive assembly provides for the semiconductor body to be an epitaxy layer. A particularly perfect semiconductor material is provided by this.

Typically, the epitaxy layer has a doping of $1 \times 10^{12}$ cm$^{-3}$ to $1 \times 10^{14}$ cm$^{-3}$. Thus, the charge carrier concentration is very low and the epitaxy layer can be used as the i zone for a PIN diode.

In a particularly advantageous embodiment of the inventive assembly, the semiconductor body is deposited on a carrier plate. The result is a reduction in power losses.

An advantageous development of the inventive assembly is for an oxide to be applied onto the second surface of the semiconductor body. The oxide having a small interface state density has the effect that the recombination at the edge of the i zone of a PIN diode is kept small. Thus, the generation of an undesired current is avoided.

Another advantageous embodiment of the inventive assembly is for the two direct current terminals to be formed at the first surface of the semiconductor body. This entails advantages as far as manufacturing is concerned and the high-frequency switch is suitable for flip-flop mounting.

In an alternative design of the inventive assembly, a direct current terminal is a doped p region and the other direct current terminal is a doped n region. The result is a desired diode.

Typically, the two direct current terminals have a doping of $1 \times 10^{18}$ cm$^{-3}$, which, due to the high charge carrier concentration, provides for a good operating performance of the diode.

A particularly preferred development of the inventive assembly can be obtained when the two direct current terminals, with the semiconductor body, form a PIN diode. The conductivity of the intrinsic region to below the high-frequency switch is controlled with this PIN diode by injecting charge carriers. This is possible due to the very great diffusion length. As a result of the low doping and the low edge recombination, the diffusion length is in the order of magnitude of millimeters.

Another advantageous embodiment of the inventive assembly provides for the two high-frequency terminals to be formed at the first surface of the semiconductor body. This brings advantages as far as manufacturing is concerned and the device is suitable for flip-flop mounting.

A preferred design of the inventive assembly is for the two high-frequency terminals each to include:

the semiconductor body, a dielectric on the semiconductor body, and a contact layer.

Thus, the high-frequency capacitance is coupled with the device and results in the desired galvanic separation of the HF path and the DC path.

Another design of the inventive assembly is for the dielectric to be an oxide. This can be realized particularly easily as far as manufacturing is concerned.

An alternative design of the inventive assembly is for the dielectric to be a dielectric stack. The result is that possible short circuits through the dielectric can be ruled out.

Another preferred development of the inventive assembly is for the dielectric stack to be formed of oxide and nitride. Thus, the requirements to the dielectric as regards the capacitance of the high-frequency terminal can be fulfilled to the extent desired. At the same time, a dielectric stack of oxide and nitride can be realized, as far as manufacturing is concerned, with conventional technology processes.

Typically, the contact layer of the inventive assembly is made of a metal. Particularly good high-frequency characteristics can be achieved by this.

In another preferred embodiment of the inventive assembly, the high-frequency switch is confined laterally by a trench. Thus, the high-frequency switch is electrically insulated from the neighboring regions.

The trench is typically filled with oxide. The recombination at the edge of the I zone is kept small by the low interface state density of the oxide. Thus, the generation of an undesired current can be avoided.

An advantageous development of the inventive assembly provides for the first surface, except for the areas of the direct current terminals and except for the areas of the high-frequency terminals, to be covered by an oxide layer. The oxide having a low interface state density has the effect that the recombination at the edge of the i zone of a PIN diode is kept small. The generation of an undesired current can thus be avoided.

BRIEF DESCRIPTION OF THE DRAWINGS

Preferred embodiments will be detailed subsequently referring to the appended drawings, in which.

DESCRIPTION OF PREFERRED EMBODIMENTS

Figure 1:
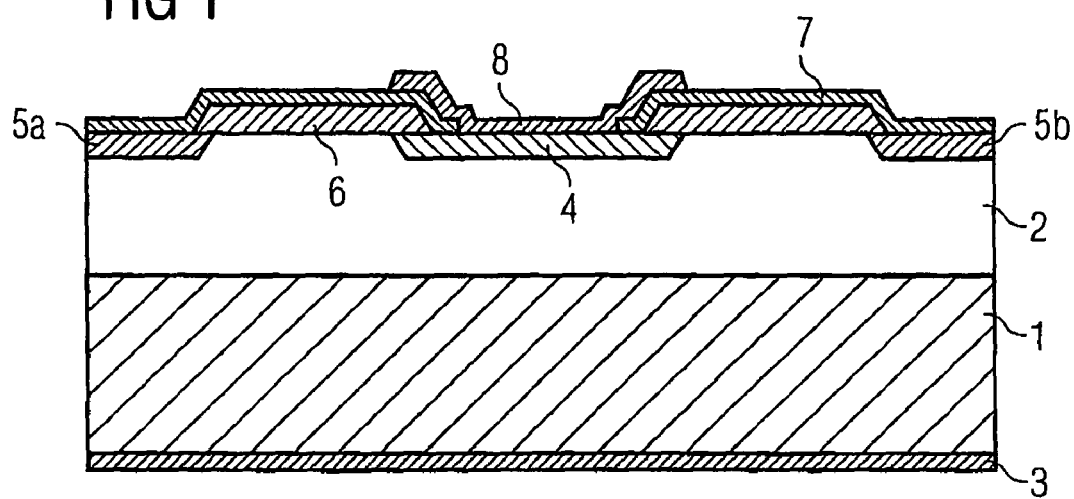
FIG. 1 is a schematic cross-sectional view of a planar vertical PIN diode having a back side contact.

The planar vertical PIN diode illustrated in FIG. 1 includes a highly doped substrate 1 made of an n material.

A lightly doped epitaxy layer 2 is grown onto the substrate 1. An Au/AuAs contact layer 3 is formed on the back side of the substrate 1.

A highly doped p region 4 is introduced into the epitaxy layer 2. The p region 4 abuts on the surface of the epitaxy layer. Additionally, two highly doped n regions 5a and 5b are introduced into the epitaxy layer 2 on both sides of the p region 4. The n regions 5a and 5b also abut on the surface of the epitaxy layer 2. An oxide layer 6 is structured on the surface of the epitaxy layer 2 such that it covers the distance between the n region 5a and the p region 4 and the n region 5b and the p region 4, respectively. The n regions 5a and 5b and parts of the p region 4 are partly covered by this oxide layer.

The surface of the structured oxide layer 6 is covered by a plasma nitride layer 7. This plasma nitride layer 7 also covers a part of the p region 4 and the n regions 5a and 5b.

The remaining uncovered part of the p region 4 is contacted by a metal layer 8. The metal layer 8 also extends over a part of the surface of the plasma nitride layer 7.

Figure 2:
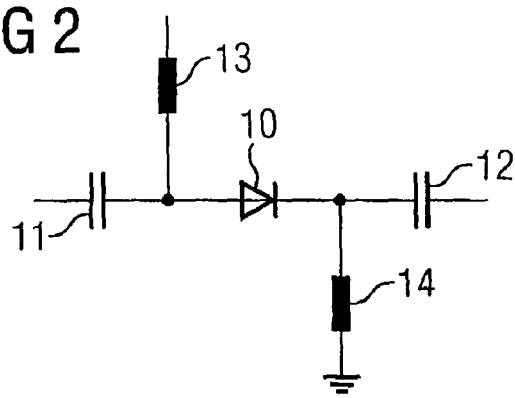
FIG. 2 is an equivalent circuit diagram of a network for applying the PIN diode as an HF switch.

The usage of a conventional PIN diode 10 for an HF switch is illustrated in FIG. 2. Additional electronic elements are required for this. In this equivalent circuit diagram, two coupling capacitors 11 and 12 are illustrated exemplarily. Furthermore, coils which are either realized in a discrete way or as lines are required. In FIG. 2, these coils are referred to by 13 and 14.

Figure 3:
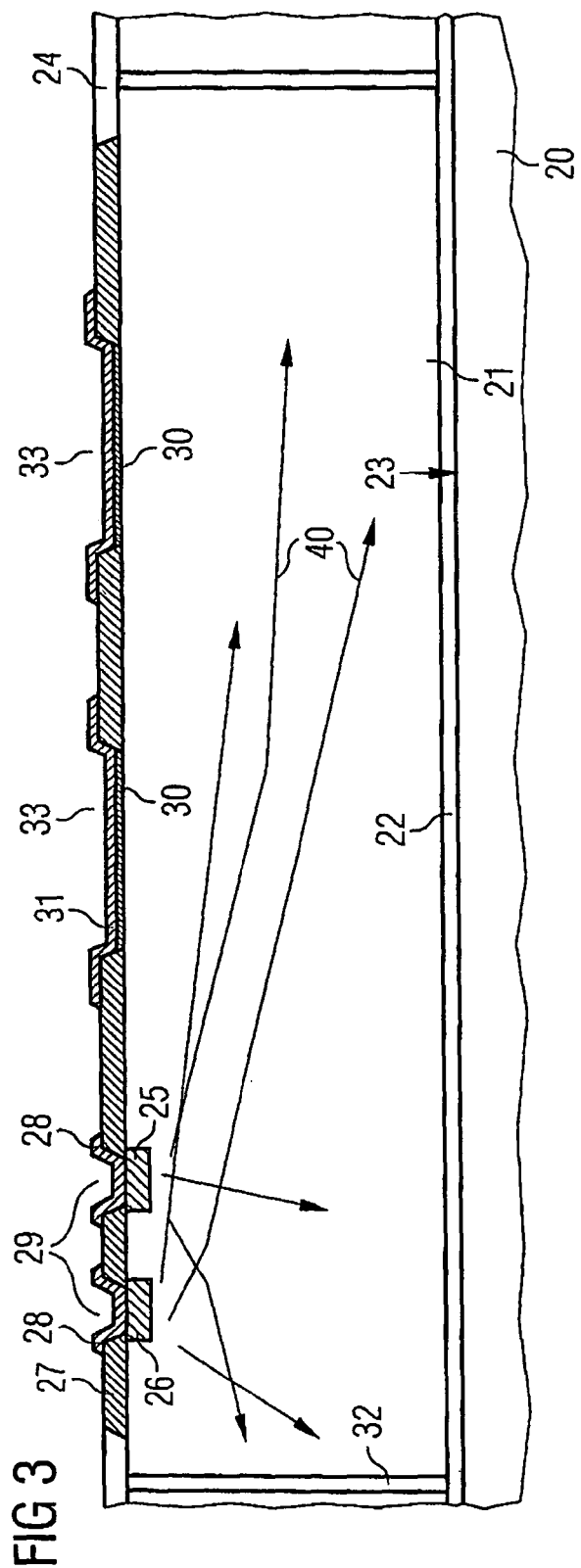
FIG. 3 is a schematic cross-sectional view of a preferred embodiment of the inventive HF switch.

The preferred embodiment of the inventive HF switch illustrated in FIG. 3 comprises a carrier plate 20 onto which a semiconductor body 21 is deposited. The carrier plate 20 is, for example, made of silicon. The semiconductor body 21 is made of an intrinsic silicon semiconductor material. The semiconductor body 21 is confined towards the carrier plate 20 by an oxide layer 22. The oxide layer 22 is made on the second surface 23 of the thinly ground semiconductor body 21 before the semiconductor body 21 is applied to the carrier plate 20.

A highly doped p region 25 and a highly doped n region 26 are introduced into the semiconductor body 21 on the first surface 24 of the semiconductor body 21. Typically, the dopant concentration of the p region and of the n region is about $1 \times 10^{18}$ cm$^{-3}$.

Oxide 27 is deposited on the first surface of the semiconductor body 21. This oxide 27 is patterned such that the first surface 24 is exposed at four positions. One respective opening of the oxide 27 is above the p region 25 and above the n region 26. The exposed surface 24 of the p region and of the n region is contacted by means of a metal 28. The metal 28 extends over a part of the oxide 27. The p region 25 and the n region 26, together with the metal contacting, each form a direct current terminal 29.

The two remaining exposed positions of the surface 24 are covered by a dielectric 30. A metal contact layer 31 is arranged above the dielectric 30 and a part of the oxide layer 24.

The semiconductor body, 21, the dielectric 30 and the metal contact layer 31 together form a high-frequency terminal 33.

Two trenches 32 laterally confining the HF switch extend from the surface 24 to the oxide layer 22. These two trenches 32 are filled with oxide.

The injection of charge carriers from the highly doped p region and the n region to the region below the high-frequency terminals is indicated in FIG. 3 by arrows 40 in the PIN diode polarized in a flow direction.

Figure 4A:
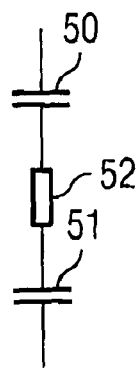
FIG. 4 is a simplified HF equivalent circuit diagram of the HF switch in a) a forward direction, and b) a reverse direction.

If the PIN diode is operated in the forward direction, a simple equivalent circuit diagram, as is shown in FIG. 4a, will include a series connection of two capacitors 50, 51 and a resistor 52. The capacitors 50, 51 have a capacitance determined by the dielectric at the high-frequency terminals. The resistor 52 is formed of the series resistance of the i zone.

The reactance of the capacities should be as small as possible with a predetermined operating frequency. Subsequently, the reactance of a typical embodiment of the inventive high-frequency switch will be estimated. In modern CMOS technologies, a dielectric stack with a thickness of 5 nm and a medium dielectric constant $\in=4$ can be manufactured. With an operating frequency of 5 GHz, the reactance of the capacitance will be $-i \times 2876$ ohm/µm$^2$. This, with a typically PIN diode area of 100×100 µm$^2$, results in a value of $-i \times 0.28$ ohm. With a corresponding dimensioning of the contact areas, this value is small compared to the series resistance of the i zone and can be compensated in the application by means of a corresponding inductivity.

Figure 4B:
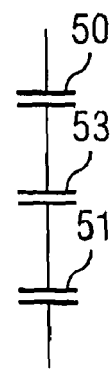

If the PIN diode is operated in the reverse direction, the equivalent circuit diagram for an inventive HF switch, as is shown in FIG. 4b, will include a series connection of three capacitors 50, 51, 53. The capacitor 53 is formed of the capacitance of the i zone. In the reverse direction, the entire i zone has a very high impedance even below the high-frequency terminals. The capacitance of the i zone is thus very low and dominates the performance of the HF switch. With a corresponding dimensioning, the insulation performance can be compared to that of a conventional PIN diode.

Figure 5:
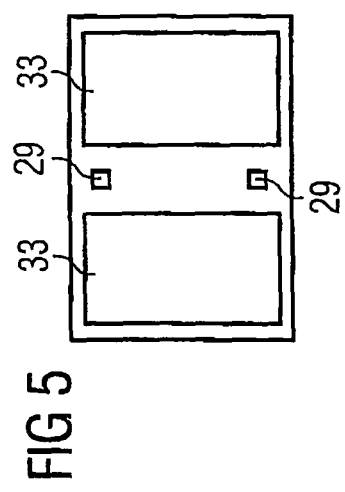
FIG. 5 shows a preferred layout of the contact areas of the DC and HF paths.

A possible design of the contact areas of the direct current terminals 29 and of the high-frequency terminals 33 is illustrated in FIG. 5. The advantages of the inventive HF switch particularly arise from the fact that the areas of the high-frequency terminals and the direct current terminals can be determined separately from one another.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A high-frequency switch including:
   (a) a continuous semiconductor body made of a semiconductor material having a first surface and a second surface,
   (b) a first and a second direct current terminal including a first and a second doped semiconductor region, respectively, the first and second doped semiconductor regions having different doping types in the continuous semiconductor body, and
   (c) a first and a second high-frequency terminal each including a dielectric on the continuous semiconductor body and a contact layer above the dielectric,
   wherein the first direct current terminal, the second direct current terminal, the first high-frequency terminal and the second high-frequency terminal are spaced apart from one another.

2. The high-frequency switch according to claim 1, wherein the semiconductor material has a resistivity of greater than 100 Ωcm.

3. The high-frequency switch according to claim 1, wherein the semiconductor material is intrinsic.

4. The high-frequency transistor according to claim 1, wherein the continuous semiconductor body is an epitaxy layer.

5. The high-frequency transistor according to claim 4, wherein the epitaxy layer has a doping of within a range from approximately $1 \times 10^{12}$ cm$^{-3}$ to approximately $1 \times 10^{14}$ cm$^{-3}$.

6. The high-frequency switch according to claim 1, wherein the continuous semiconductor body is disposed on a carrier plate.

7. The high-frequency switch according to claim 1, wherein an oxide layer is arranged on the second surface of the continuous semiconductor body.

8. The high-frequency switch according to claim 1, wherein the two direct current terminals are formed on the first surface of the continuous semiconductor body.

9. The high-frequency switch according to claim 1, wherein the first direct current terminal includes a doped p region and the second direct current terminal includes a doped n region.

10. The high-frequency switch according to claim 1, wherein the first and second doped regions have a doping concentration of approximately $1 \times 10^{18}$ cm$^{-3}$.

11. The high-frequency switch according to claim 1, wherein the first and second direct current terminals, with the continuous semiconductor body, form a PIN diode.

12. The high-frequency transistor according to claim 1, wherein the two high-frequency terminals are formed on the first surface of the continuous semiconductor body.

13. The high-frequency switch according to claim 1, wherein the dielectric comprises an oxide.

14. The high-frequency switch according to claim 1, wherein the dielectric is formed of oxide and nitride.

15. The high-frequency switch according claim 1, wherein the contact layer comprises a metal contact.

16. The high-frequency switch according to claim 1, wherein the high-frequency switch is laterally confined by at least one trench.

17. The high-frequency switch according to claim 16, wherein the trench is filled with oxide.

18. The high-frequency switch according to claim 1, wherein the first surface, except for the areas of the direct current terminals and except for the areas of the high-frequency terminals, is covered by an oxide layer.

19. The high-frequency switch according to claim 1, wherein the first and the second high-frequency terminal each form a high-frequency capacitance with the continuous semiconductor body for providing a high-frequency signal path between the first and second terminal.

20. The high-frequency switch according to claim 1, wherein the first and the second high-frequency terminal are galvanically separated from the continuous semiconductor body with respect to a DC signal.

21. High-frequency switch according to claim 1, wherein the RF terminals on the continuous semiconductor body are arranged in a distance from the direct current terminals on the continuous semiconductor body wherein the distance is less than the diffusion length of charge carriers in the continuous semiconductor body.

22. High-frequency switch according to claim 1, wherein the direct current terminals are configured to control the conductivity of the continuous semiconductor body below the high-frequency terminals by means of charge carrier injection into the continuous semiconductor body.

23. The high-frequency switch according to claim 19, wherein the direct current terminals are configured to control the conductivity of the high-frequency signal path between the first and second high-frequency terminal by means of injection of charge carriers into the continuous semiconductor body.

* * * * *